(12) United States Patent
Wang et al.

(10) Patent No.: US 10,050,088 B2
(45) Date of Patent: Aug. 14, 2018

(54) ORGANIC LIGHT-EMITTING DIODE DISPLAY PANEL HAVING THE HOLE TRANSPORT UNITS CORRESPONDING TO THE LIGHT EMITTING DEVICES OF TWO DIFFERENT COLORS HAVE DIFFERENT MOBILITY

(71) Applicants: Shanghai Tianma AM-OLED Co., Ltd., Shanghai (CN); Tianma Micro-Electronics Co., Ltd., Shenzhen (CN)

(72) Inventors: Xiangcheng Wang, Shanghai (CN); Jinghua Niu, Shanghai (CN); Wei He, Shanghai (CN); Yuji Hamada, Shanghai (CN); Chen Liu, Shanghai (CN)

(73) Assignees: SHANGHAI TIANMA AM-OLED CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 15/595,476

(22) Filed: May 15, 2017

(65) Prior Publication Data
US 2017/0250232 A1 Aug. 31, 2017

(30) Foreign Application Priority Data
Nov. 21, 2016 (CN) .......................... 2016 1 1043950

(51) Int. Cl.
*H01L 27/32* (2006.01)
*H01L 51/00* (2006.01)
(Continued)

(52) U.S. Cl.
CPC ...... *H01L 27/3211* (2013.01); *H01L 51/0097* (2013.01); *H01L 51/5036* (2013.01);
(Continued)

(58) Field of Classification Search
CPC ............. H01L 27/3206; H01L 51/5036; H01L 51/5056; H01L 51/5072
See application file for complete search history.

(56) References Cited

U.S. PATENT DOCUMENTS

2017/0365645 A1* 12/2017 Kim .................... H01L 51/5036

FOREIGN PATENT DOCUMENTS

CN 103715221 A 4/2014

* cited by examiner

*Primary Examiner* — Hoai V Pham
(74) *Attorney, Agent, or Firm* — Anova Law Group, PLLC

(57) ABSTRACT

An organic light-emitting diode (OLED) display panel and an OLED display device are provided. The OLED display panel comprises a first substrate; a first electrode layer disposed on the first substrate and including a plurality of first electrodes; a first hole transport layer disposed on a surface of the first electrode layer far away from the first substrate, and including a plurality of hole transport units, wherein the plurality of hole transport units are arranged in correspondence with the plurality of first electrodes respectively; a plurality of light-emitting devices disposed on a surface of the first hole transport layer far away from the first electrode layer, wherein the plurality of the light-emitting devices are arranged in correspondence with the plurality of hole transport units respectively, and the hole transport units corresponding to the light-emitting devices of two different colors have different mobility; and a second electrode layer.

20 Claims, 4 Drawing Sheets

(51) Int. Cl.
*H01L 51/50* (2006.01)
*H01L 51/52* (2006.01)
(52) U.S. Cl.
CPC ...... *H01L 51/5234* (2013.01); *H01L 51/5271* (2013.01); *G09G 2380/02* (2013.01)

ORGANIC LIGHT-EMITTING DIODE DISPLAY PANEL HAVING THE HOLE TRANSPORT UNITS CORRESPONDING TO THE LIGHT EMITTING DEVICES OF TWO DIFFERENT COLORS HAVE DIFFERENT MOBILITY

CROSS-REFERENCES TO RELATED APPLICATIONS

This application claims priority of Chinese Patent Application No. 201611043950.8, filed on Nov. 21, 2016, the entire contents of which are hereby incorporated by reference.

FIELD OF THE INVENTION

The present disclosure generally relates to the field of organic light-emitting diode (OLED) technology and, more particularly, relates to an OLED display panel and an OLED display device.

BACKGROUND

An organic light-emitting diode (OLED) display panel is a self-luminous display device with an organic thin film as a luminous body, which has the advantages of ultra-thin thickness, high brightness, high luminous efficiency and good shock resistance. In an OLED display panel, each subpixel area is often defined by a pixel definition layer. To improve the packing effect of the subpixel packaging, spacers may be provided on the pixel defining layer between any two adjacent subpixels.

However, in an existing OLED display panel, subpixels adjacent to a subpixel which is turned on may emit undesired light, such that the crosstalk of the OLED display panel may be increased, and the display performance of the OLED display panel may be degraded.

The disclosed OLED display panel and OLED display device thereof are directed to solve one or more problems set forth above and other problems.

BRIEF SUMMARY OF THE DISCLOSURE

One aspect of the present disclosure provides an organic light-emitting diode (OLED) display panel. The organic light-emitting diode (OLED) display panel comprises a first substrate; a first electrode layer disposed on the first substrate and including a plurality of first electrodes; a first hole transport layer disposed on a surface of the first electrode layer far away from the first substrate, and including a plurality of hole transport units, wherein the plurality of hole transport units are arranged in correspondence with the plurality of first electrodes respectively; a plurality of light-emitting devices disposed on a surface of the first hole transport layer far away from the first electrode layer, wherein the plurality of the light-emitting devices are arranged in correspondence with the plurality of hole transport units respectively, the light-emitting devices include m number of colors, where m is a positive integer, one light-emitting device corresponds to one color, and the hole transport units corresponding to the light-emitting devices of two different colors have different mobility; and a second electrode layer disposed on a surface of the plurality of light-emitting devices far away from the first hole transport layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiments, persons of ordinary skill in the art may derive other embodiments consistent with the present disclosure, all of which are within the scope of the present invention. Further, in the present disclosure, the disclosed embodiments and the features of the disclosed embodiments may be combined under conditions without conflicts.

Figure 1:
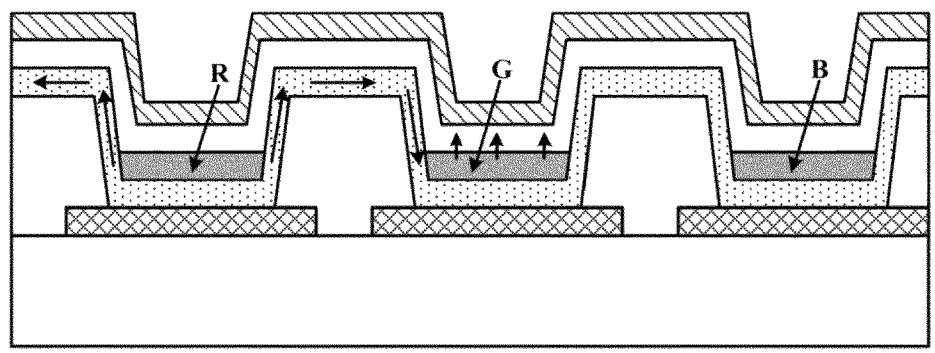
FIG. 1 illustrates a schematic view of an existing organic light-emitting diode (OLED) display.

FIG. 1 illustrates a schematic view of an existing organic light-emitting diode (OLED) display. As shown in FIG. 1, the subpixels of the OLED display panel may be arranged in the order of red subpixel R, green subpixel G and blue subpixel B. When the red subpixel R is intentionally lit or turned on, the carriers in the red subpixel R may drift laterally to the surrounding subpixels, such as to the adjacent green subpixel G. Consequently, the green subpixel G may emit visible green light due to the high luminous efficiency of the green subpixel G.

That is, the green subpixel G may be undesirably lit or emits undesired light when the red subpixel R is intentionally lit. Accordingly, the red subpixel R may be undesirably lit when the green subpixel G is intentionally lit. The red subpixel R and the green subpixel G may be undesirably lit when B is intentionally lit. As a result, the crosstalk of the OLED display panel may be increased, and the display performance of the OLED display panel may be degraded.

The present disclosure provides an improved display panel capable of suppressing the undesired light emitted by the adjacent subpixels.

Figure 2:
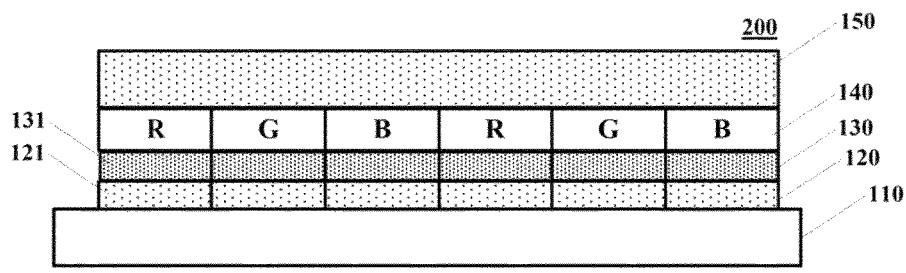
FIG. 2 illustrates a schematic view of an exemplary OLED display panel consistent with disclosed embodiments.

FIG. 2 illustrates a schematic view of an exemplary OLED display panel consistent with disclosed embodiments. As shown in FIG. 2, the organic OLED display panel 200 may comprise: a first substrate 110, a first electrode layer 120, a first hole transport layer 130, a plurality of light-emitting devices 140, a second electrode layer 150, a plurality of first electrodes 121, and a plurality of hole transport units 131. Other appropriate components may also be included.

In particular, the first electrode layer 120 may be disposed on the first substrate 110, and the first electrode layer 120 may include the plurality of first electrodes 121. The first hole transport layer 130 may be disposed on the surface of the first electrode layer 120 far away from the first substrate 110, and the first hole transport layer 130 may include the plurality of hole transport units 131. The plurality of hole transport units 131 may be disposed in correspondence with the plurality of first electrodes 121 respectively.

The plurality of light-emitting devices 140 may be disposed in correspondence with the plurality of hole transport units 131 respectively, and the plurality of light-emitting devices 140 may be disposed on the side of the first hole transport layer 130 far away from the first electrode layer 120. The plurality of light-emitting devices 140 include m number of colors, and the hole transport unit 131 corresponding to the light-emitting devices 140 emitting any two different colors may have different mobility. The second electrode layer 150 may be disposed on the surface of the plurality of light-emitting devices 140 far away from the first hole transport layer 131.

The first substrate 110 may be made of rigid transparent materials (e.g., glass) or flexible transparent materials (e.g., polyimide). The light-emitting device may include organic light-emitting diode (OLED) devices, quantum dots (QDs) light-emitting devices, or other appropriate light-emitting devices capable of emitting light for displaying videos and/or images.

In one embodiment, as shown in FIG. 2, the first substrate 110 may be a flexible substrate, and the light-emitting device may be an OLED device. That is, the corresponding OLED display panel may be a flexible OLED display panel. The flexible OLED display panel may have characteristics such as low power consumption and flexibility, and may be applicable to various display devices and, more particularly, suitable for wearable display devices. The material of the flexible substrate may include polyimide or polyethylene terephthalate resin, which is for illustrative purposes and is not intended to limit the scope of the present disclosure. Any materials suitable for the flexible substrate fall within the scope of the disclosure.

In another embodiment, the first substrate may be a rigid substrate and, accordingly, a rigid OLED display panel may be provided. The rigid organic light-emitting diode display panel may have broad applications and will not be further described in the present disclosure. The materials of the first substrate may be selected according to various application scenarios.

In the disclosed embodiments, the first electrode layer 120 may be disposed on the first substrate 110, and the first electrode layer 120 may include the plurality of first electrodes 121. According to the structure of the organic light-emitting diode display panel, in one embodiment, as shown in FIG. 2, the first electrode layer 120 may be an anode of the OLED display panel. That is, a positive voltage may be applied to the first electrodes 121 of the first electrode layer 120 during electroluminescence.

The first electrode layer 120 may include a high work function material, such as ITO (indium tin oxide or tin-doped indium oxide) having a work function as high as 4.5 eV to 5.3 eV, good stability and high transparency. In particular, the first electrode 121 may include at least: a reflective film and a transparent conductive film. The reflective film may be disposed on the first substrate 110, and the material of the reflective film may include silver. The transparent conductive film may be disposed on the surface of the reflective film far away from the first substrate 110, and the material of the transparent conductive thin film may include indium tin oxide, and indium zinc oxide, etc.

The materials of the first electrode layer are for illustrative purposes and are not intended to limit the scope of the present disclosure. The materials of the first electrode layer may be selected according to various application scenarios.

The second electrode layer 150 may be disposed on the surface of the plurality of light-emitting devices 140 far away from the first hole transport layer 131. According to the structure of the OLED display panel, in one embodiment, as shown in FIG. 2, the second electrode layer 150 may be a cathode of the OLED display panel. That is, a negative voltage may be applied to the second electrode layer 150 during electroluminescence.

The second electrode layer 150 may include a low work function material such as Ag, Al, Ca, In, Li, Mg, or a low work function composite metal material. For example, the second electrode layer 150 may include at least one of a magnesium-silver alloy, a silver-metal, a silver-ytterbium alloy, and a silver-rare earth metal alloy, which is for illustrative purposes and is not intended to limit the scope of the present disclosure. The materials of the second electrode layer may be selected according to various application scenarios.

Further, the first hole transport layer 130 may be disposed on the surface of the first electrode layer 120 far away from the first substrate 110. The first hole transport layer 130 may be disposed between the first electrode layer 120 and the light-emitting devices 140 for enhancing the ability of the anode to inject holes and transport holes to the light-emitting devices 140. The first hole transport layer 130 may include the plurality of hole transport units 131. The plurality of hole transport units 131 may be independent from each other.

The plurality of hole transport units 131 may be disposed in correspondence with the plurality of first electrodes 121, respectively. The plurality of hole transport units 131 may also be disposed in correspondence with the plurality of light-emitting devices 140, respectively. The hole transport units 131 may enhance the hole injection and transport capability of the anode, such that the injected hole concentration of the corresponding light-emitting devices 140 may be increased and, accordingly the recombination efficiency and luminous efficiency of the light-emitting devices 140 may be improved.

The plurality of light-emitting devices 140 may be disposed in correspondence with the plurality of hole transport units 131, respectively. The light-emitting devices 140 may be disposed on the surface of the first hole transport layer 130 far away from the first electrode layer 120. Each light-emitting device 140 may be a subpixel.

For any one of the plurality of light-emitting devices 140, when a positive voltage is applied to the first electrode 121 and a negative voltage is applied to the second electrode layer 150, the holes generated by the first electrode 121 as the anode may be injected into the corresponding light-emitting device 140, and the electrons generated by the second electrode layer 150 as the cathode may also be injected into the corresponding light-emitting device 140. The binding of the electrons and holes injected into the light-emitting device 140 may generate excitons. Subsequent radiative transition of the excitons may enable the light-emitting device 140 to emit light.

Further, the light-emitting devices 140 may include m number of colors, and m may be an integer greater than or equal to 3. The light-emitting devices 140 of different colors may emit light in different colors. For example, the light emitted from a red light-emitting device is red.

In the disclosed embodiments, the material of a light-emitting device may include organic small-molecule light-emitting materials or high-molecular-weight polymer light-emitting materials, which are not limited by the present disclosure.

In one embodiment, as shown in FIG. 2, m may be equal to 3, and the light-emitting devices 140 may include a red light-emitting device R, a green light-emitting device G, and a blue light-emitting device B. In another embodiment, m may be equal to 4, and the light-emitting devices may include a red light-emitting device, a green light-emitting device, and a blue light-emitting device, and further a yellow light-emitting device or a white light-emitting device. The colors of the light-emitting devices are for illustrative purposes and are not intended to limit the scope of the present disclosure. In particular application, the colors of the light-emitting devices may vary according to various application scenarios.

For better explanation of the technical solutions provided in the disclosed embodiments, an OLED display panel arranged according to specific colors will be described as an example. For example, in one embodiment, as shown in FIG. 2, the plurality of light-emitting devices 140 may be arranged in a row direction and a column direction. That is, the plurality of light-emitting devices 140 may be arranged in a matrix. Given m=3, the light-emitting devices 140 in any row may be sorted by the colors of red (R), green (G), blue (B), red (R), green (G), blue (B). Every three light-emitting devices 140 in a same row may constitute one pixel.

In certain embodiments, the order of color arrangement of any two adjacent rows of light-emitting devices may be different. For example, the first row of light-emitting devices may be arranged in an order of R, G, B, R, G and B, and the second row of light-emitting devices may be arranged in an order of B, R, G, B, R and G, which are for illustrative purposes and are not intended to limit the scope of the present disclosure. In particular application, the color arranging order of the light-emitting devices may vary according to various application scenarios.

Those skilled in the art would understand that the structures described and illustrated in the disclosed embodiments are only partial structures of an OLED display panel. An OLED display panel also includes other structures such as a glass cover plate and etc., which are not specifically described and illustrated in the present disclosure.

As discussed in the background, in an existing OLED display panel, undesired light may be emitted by adjacent subpixels. For example, in an existing OLED panel in which red subpixels R, green subpixels G and blue subpixels are alternately arranged, to intentionally light the red subpixel R, a positive voltage may be applied to the anode of the red subpixel R and a negative voltage may be applied to the cathode. The holes may be injected from the anode and the electrons may be injected from the cathode into the red subpixel R. In the red subpixel R, excitons formed by the binding of the injected electrons and holes may enable the red subpixel R to emit red light by electroluminescence.

However, some of the carriers injected into the red subpixel R may drift laterally to the neighboring subpixels through the hole-transport layer, for example, to the adjacent green subpixel G, then the excitons formed by the binding of the injected electrons and holes in the green subpixel G may enable the subpixel G to emit green light by electroluminescence. Similarly, the red subpixels R may emit undesired light when the green subpixels G are turned on. The red subpixels R and the green subpixels G may emit undesired light when the blue subpixels B are turned on.

That is, in the existing OLED display panel, when one subpixel is turned on, some of the carriers in the lighted or turned-on subpixel may laterally drift to the adjacent subpixels through the hole transport layer, causing the adjacent subpixels to emit undesired light and increase the crosstalk.

To solve one or more problems set forth above, in the disclosed embodiments, the light-emitting devices of different colors may be provided with corresponding hole transport units 131, and the carrier mobility of the hole transport units corresponding to the light-emitting devices of different colors may be adjusted. In particular, the hole transport units corresponding to the light-emitting devices of any two different colors may be provided with different mobility.

That is, through providing the hole transport units 131 corresponding to the light-emitting devices 140 of any two different colors with different mobility, the undesired light emitted by adjacent subpixels may be suppressed. For example, to turn on the red light-emitting device R, which is adjacent to the green light-emitting device G and the blue light-emitting device B in the same row, a positive voltage may be applied to the first electrode 121 of the red light-emitting device R and a negative voltage may be applied to the second electrode layer 150 of the red light-emitting device R.

Electrons in the second electrode layer 150 and holes in the first electrode 121 may be injected into the red light-emitting device R. Excitons produced by the binding of electrons and holes may cause the red light-emitting device R to emit red light by electroluminescence. The hole transport unit 131 disposed between the first electrode 121 and the red light-emitting device R may enhance the injection and transport capability of the holes and, thus, increase the number of holes injected into the light-emitting device 140.

The holes in the intentionally lighted red light-emitting device R may easily drift laterally to the surrounding light-emitting devices 140 through the first hole transport layer 130. In the disclosed embodiments, the mobility of the hole transport unit 131 corresponding to the light-emitting devices 140 of different colors may be different. Thus, when the holes are drifting from the hole transport unit 131 corresponding to the lighted red light-emitting device R to the hole transport unit 131 corresponding to the adjacent light-emitting devices 140, it may be difficult for the holes to transit between the two hole transport units 131 having different mobility. Accordingly, the lateral current of the holes may be reduced, such that the number of holes entering the adjacent different color light-emitting devices 140 may be decreased, and the undesired light emitted by the adjacent subpixels may be suppressed.

In the disclosed OLED display panel, when the light-emitting device 140 of any color is lit, in the first hole transport layer 130, the hole transport units 131 having different mobility may reduce the lateral current of the holes, thereby suppressing the undesired light emitted by the adjacent subpixels. That is, the plurality of hole transport units 131 independent from each other may reduce the lateral drift velocities of the holes to the adjacent light-emitting devices 140, such that the lateral current may be reduced and, accordingly, the number of holes laterally transported to the adjacent light-emitting devices 140 may be significantly reduced.

Thus, the effect of the sub-pixels being undesirably lit may be weaken in the OLED display panel, i.e., the undesired light emitted by the adjacent subpixels may be suppressed. The luminous efficiency of the light-emitting devices 140 may be improved, the crosstalk may be reduced, and the display performance of the organic light-emitting diode display panel may be improved, accordingly.

In the disclosed OLED display panel, a plurality of light-emitting devices may be disposed corresponding to a plurality of hole transport units, respectively, and the hole transport units corresponding to the light-emitting devices of different colors may have different mobility, which may increase the difficulties for the holes to transit between the two hole transport units having different mobility. Thus, the lateral current of the holes may be reduced and, accordingly, the number of holes transported to the adjacent light-emitting devices of different colors may be reduced, and the undesired light emitted by the adjacent subpixels may be suppressed.

Figure 3A:
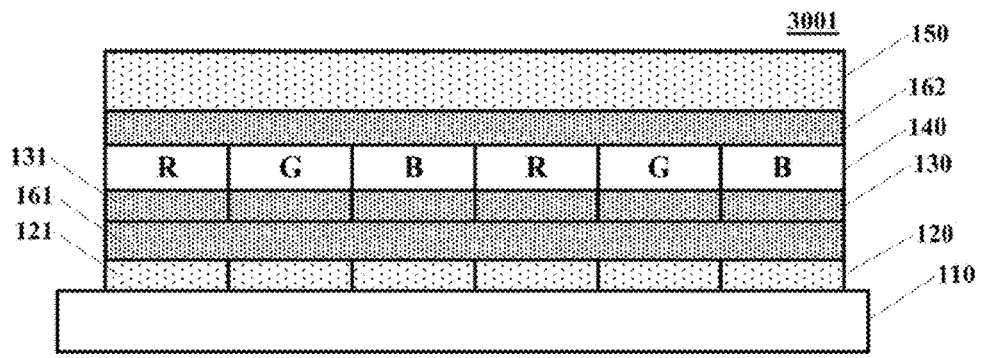
FIG. 3A illustrates a schematic view of another exemplary OLED display panel consistent with disclosed embodiments.

FIG. 3A illustrates a schematic view of another exemplary OLED display panel consistent with disclosed embodiments. The similarities between FIG. 3A and FIG. 2 are not repeated here, while certain differences may be explained.

As shown in FIG. 3A, different from the OLED display panel 200 in FIG. 2, the OLED display panel 3001 in FIG. 3 may further include a second hole transport layer 161 and an electron transport layer 162. In particular, the second hole transport layer 161 may be disposed on the surface of the first electrode layer 120 far away from the first substrate 110. The electron transport layer 162 may be disposed on the surface of the plurality of light-emitting devices 140 far away from the first hole transport layer 130.

The second hole transport layer 161 may be disposed between the first electrode layer 120 and the first hole transport layer 130 to enhance the capability of the anode to inject holes into and transport holes to the light-emitting device 140. The electron transport layer 162 may be disposed between the light-emitting devices 140 and the second electrode layer 150, to enhance the capability of the cathode to inject holes into and transport electrons to the light-emitting devices 140, thereby improving the recombination efficiency and improving the luminescent efficiency of the light-emitting devices 140.

The second hole transport layer 161 may be made of hole transport materials, and the electron transport layer 162 may be made of electron transport materials. The hole transport material and the electron transport material may vary according to various application scenarios. For example, the hole transporting material may include aromatic polyamine compounds, such as triphenylamine derivatives. The electron transporting material may include aromatic compounds, such as 8-hydroxyquinoline aluminum or 1,2,4-triazole derivatives.

It should be noted that, the hole transport materials and electron transport materials are for illustrative purposes and are not intended to limit the scope of the present disclosure. The hole transport materials and electron transport materials may be selected according to various application scenarios.

Figure 3B:
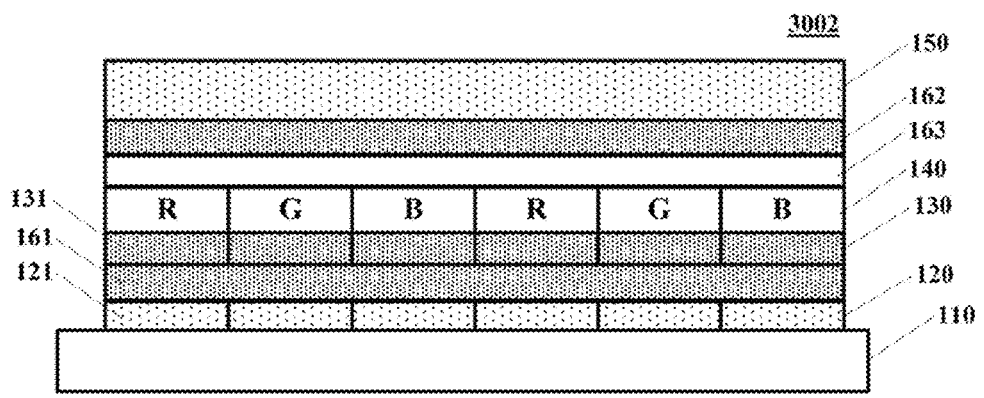
FIG. 3B illustrates a schematic view of another exemplary OLED display panel consistent with disclosed embodiments.

FIG. 3B illustrates a schematic view of another exemplary OLED display panel consistent with disclosed embodiments. The similarities between FIG. 3B and FIG. 3A are not repeated here, while certain differences may be explained.

As shown in FIG. 3B, different from the OLED display panel 3001 in FIG. 3A, the OLED display panel 3002 in FIG. 3B may further include a hole blocking layer 163. In particular, the hole blocking layer 163 may prevent the holes in the light-emitting devices 140 from being transported to the electron transport layer 162, such that the vertical leakage currents may be suppressed. That is, the holes may be kept in the light-emitting devices 140. The holes injected into the light-emitting devices 140 may be free from vertical leakage currents, such that the recombination efficiency may be improved. In addition, the hole blocking layer 163 may also be capable of blocking the luminescent excitons from diffusing to the electron transport layer 162, i.e., blocking the luminescent excitons in the light-emitting devices 140. Thus, the luminous efficiency of the light-emitting devices 140 may be improved The hole blocking layer 163 may include hole blocking materials. The hole blocking materials may vary according to various application scenarios. For example, the materials of the hole blocking layer 163 may include star-shaped aromatic compounds, such as a star-shaped aromatic compounds comprising 1,10-phenanthroline derivative, 1,3,5-tris (N-phenyl-2-benzimidazole) benzene, and 1,3,5-phenyl. The hole blocking materials are for illustrative purposes and are not intended to limit the scope of the present disclosure. The hole blocking materials may be selected according to various application scenarios.

Figure 4:
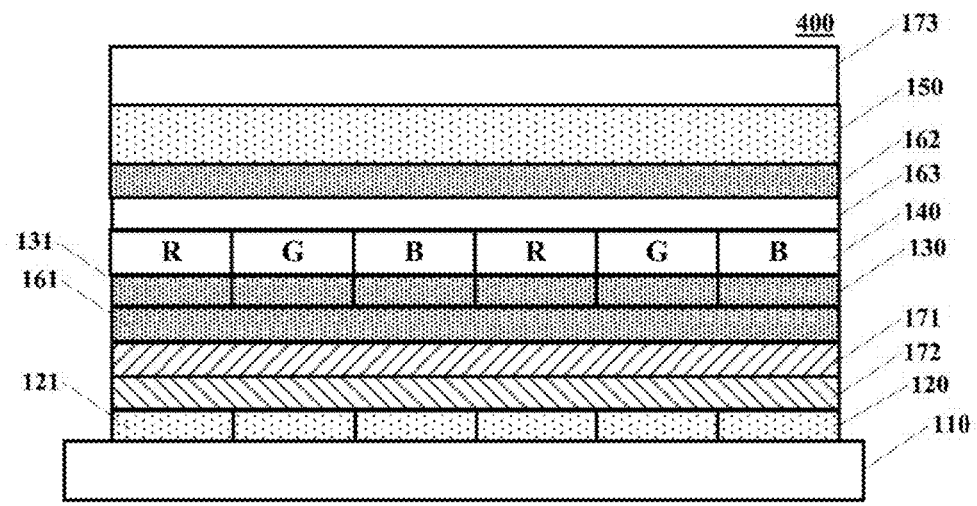
FIG. 4 illustrates a schematic view of another exemplary OLED display panel consistent with disclosed embodiments.

FIG. 4 illustrates a schematic view of another exemplary OLED display panel consistent with disclosed embodiments. The similarities between FIG. 4 and FIG. 3B are not repeated here, while certain differences may be explained. As shown in FIG. 4, different from the OLED display panel 3002 in FIG. 3B, the OLED display panel 400 in FIG. 4 may further include a hole injection layer 171, a buffer layer 172, and a capping layer 173.

In particular, the hole injection layer 171 may be disposed on the surface of the second hole transport layer 161 far away from the light-emitting devices 140. The buffer layer 172 may be disposed between the first electrode layer 120 and the hole injection layer 171. The capping layer 173 may be disposed on the surface of the second electrode layer 150 far away from the light-emitting devices 140.

Both the hole injection layer 171 and the buffer layer 172 may be able to reduce the interfacial potential barrier between the first electrode layer 120 and the first hole transport layer 130, and minimize the energy barrier for the hole transition from the first electrode layer 120, thereby increasing the hole injection and transport capacity. Thus, more holes may be injected into the light-emitting devices 140, and, accordingly, the recombination efficiency and the luminescent efficiency of the light-emitting devices 140 may be increased.

In certain embodiments, the OLED display panel may further comprise film structures such as an electron injection layer and an electron blocking layer. The film structure of the OLED display panel may vary according to various application scenarios. Film structures are not specifically limited by the present disclosure In one embodiment, the mobility $Mobility_R$ of the hole transport unit 131 corresponding to the red light-emitting device R and the mobility $Mobility_G$ of the hole transport unit 131 corresponding to the green light-emitting device G may be smaller than the mobility $Mobility_B$ of the hole transport unit 131 corresponding to the blue light-emitting device B.

The blue light-emitting device B may include film materials for transporting electrons, i.e., the more electrons and fewer holes may be injected into the blue light-emitting device B. Thus, the recombination efficiency of the blue light-emitting device B may be relatively low, leading to a high threshold voltage of the blue light-emitting device B. The film materials of the red light-emitting device R and the green light-emitting device G may maintain a relatively good balance between the number of electrons and the number of holes. Thus, the recombination efficiencies of the red light-emitting device R and the green light-emitting device G may be relatively high, and the threshold voltages of the corresponding red light-emitting device R and the green light-emitting device G may be relatively low.

When the threshold voltage of the blue light-emitting device B is substantially high, the holes may laterally drift to the adjacent red light-emitting device R and the green light-emitting device G, causing the red light-emitting device R and the green light-emitting device G to emit visually recognizable lights. That is, adjacent subpixels may be undesirably lit or emit undesired light.

To solve the problem set forth above, the hole transport unit 131 corresponding to the blue light-emitting device B may be provided with a high mobility Mobility$_B$ to increase the number of holes injected into the blue light-emitting device B the recombination efficiency of the blue light-emitting device B may be increased. Accordingly, the threshold voltage of the blue light-emitting device B may be reduced.

When both Mobility$_R$ and Mobility$_G$ are smaller than Mobility$_B$, the number of holes injected into the blue light-emitting device B may be large, and the number of holes injected into the red light-emitting device R and the green light-emitting device G may be small. Thus, the threshold voltage difference between the blue light-emitting device B and the red light-emitting device R, and the threshold voltage difference between the blue light-emitting device B and the green light-emitting device G may be reduced, respectively, thereby suppressing the undesired light.

The ratio of Mobility$_B$ to Mobility$_G$ may vary according to various application scenarios. In one embodiment, the ratio of Mobility$_B$ to Mobility$_G$ may be configured to be approximately greater than or equal to 5. Further, the ratio of Mobility$_B$ to Mobility$_G$ may be configured to be approximately greater than or equal to 10. The luminous efficiency of the green light-emitting device G may be substantially high and the maximum value may exceed 70. However, the luminous efficiency of the blue light-emitting device B may be substantially low and the maximum value may not exceed 20. Thus, the green light-emitting device G may easily emit green light recognizable by the naked eyes due to the lateral drift of the holes.

In the disclosed embodiments, the ratio of Mobility$_B$ to Mobility$_G$ may be configured to be approximately greater than or equal to 5. The hole transport unit 131 corresponding to the blue light-emitting device B may significantly increase the number of holes injected into the blue light-emitting device B, and may reduce the threshold voltage difference between the blue light-emitting device B and the green light-emitting device G, suppressing the undesired light emitted by the subpixels. In one embodiment, the Mobility$_G$ may be smaller than the Mobility$_R$.

The film materials of the red light-emitting device R and the green light-emitting device G may maintain a relatively good balance between the number of electrons and the number of holes. However, the luminescent efficiency of the green light-emitting device may be higher than the luminescent efficiency of the red light-emitting device. Thus, the threshold voltage of the green light-emitting device G may be lower than that of the red light-emitting device R.

When Mobility$_G$ is smaller than the Mobility$_R$, the hole transport unit 131 corresponding to the red light-emitting device R may increase the number of holes injected into the red light-emitting device R. And the hole mobility of the hole transport unit 131 corresponding to the green light-emitting device G may be relatively low. Accordingly, the threshold voltage of the green light-emitting device G may be reduced, and the threshold voltage of the red light-emitting device R may be increased, suppressing the undesired light.

The ratio of Mobility$_R$ to Mobility$_G$ may vary according to various application scenarios. In one embodiment, the ratio of Mobility$_R$ to Mobility$_G$ may be configured to be approximately greater than 1. Further, the preferred ratio of Mobility$_R$ to Mobility$_G$ may be configured to be approximately greater than or equal to 1.2. The luminous efficiency of the green light-emitting device G may be slightly higher than the luminous efficiency of the red light-emitting device R.

In the disclosed embodiments, the ratio of Mobility$_R$ to Mobility$_G$ may be configured to be approximately greater than 1. Consequently, the hole transport unit 131 corresponding to the red light-emitting device R may increase the hole mobility and the number of holes injected into the red light-emitting device R. The threshold voltage difference between the red light-emitting device R and the green light-emitting device G may be reduced, suppressing the undesired light emitted by subpixels.

Figure 5:
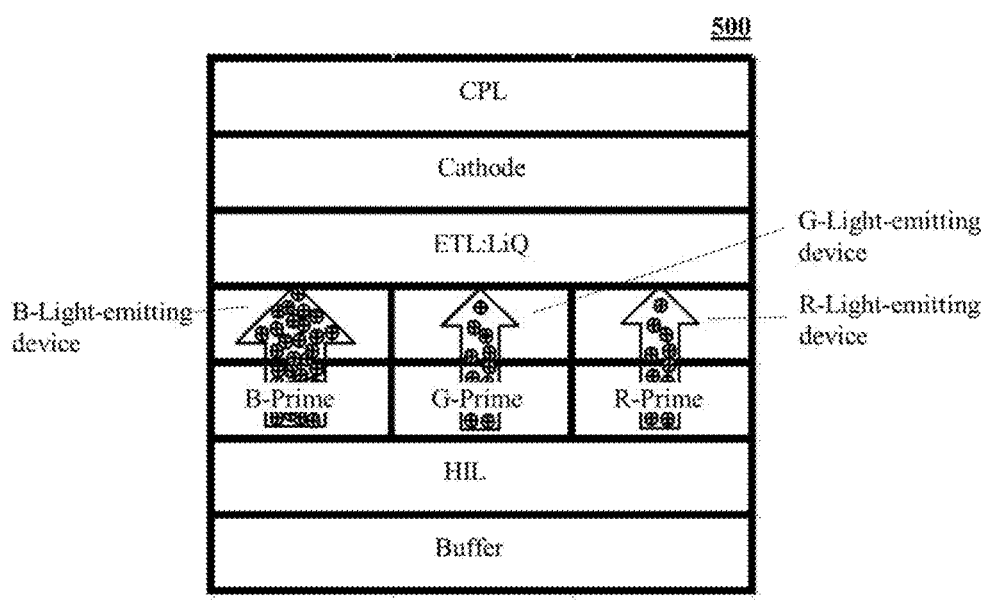
FIG. 5 illustrates a schematic view of another exemplary OLED display panel consistent with disclosed embodiments.

FIG. 5 illustrates a schematic view of another exemplary OLED display panel consistent with disclosed embodiments. As shown in FIG. 5, the OLED display panel 500 may include a plurality of blue (B), green (G) and red (R) light-emitting devices. In particular, the blue (B), green (G) and red (R) light-emitting devices may respectively have the following structures:

B: Buffer/HIL/B-Prime/B-light-emitting device/ETL: LiQ/Cathode/CPL;

G: Buffer/HIL/G-Prime/G-light-emitting device/ETL: LiQ/Cathode/CPL;

R: Buffer/HIL/R-Prime/R-light-emitting device/ETL: LiQ/Cathode/CPL.

That is, the OLED display panel 500 may include a buffer layer Buffer, a hole injection layer HIL, R-Prime, G-Prime and B-Prime as a plurality of hole transport units of blue, green and red colors respectively, a plurality of light-emitting devices, a plurality of electron transfer unit ETL, a cathode, and a capping layer CPL. The B-light-emitting device, the G-light-emitting device and the R-light-emitting device may be the blue light-emitting device, the green light-emitting device, and the red light-emitting device, respectively. R-Prime, G-Prime or B-Prime may be arranged in correspondence with the B-light-emitting device, G-light-emitting device and R-light-emitting device respectively. The material of ETL may include LiQ, i.e., 8-hydroxyquinolinato lithium.

The mobility ratio of the B-Prime to the G-Prime may be configured to be approximately greater than or equal to 10. Consequently, more holes may be injected into the blue light-emitting device than the green light-emitting device and the red light-emitting device, suppressing the undesired light emitted by the green light-emitting device and the red light-emitting device when the blue light-emitting device is intentionally turned on. The mobility ratio of the R-Prime to the G-Prime may be configured to be approximately greater than or equal to 1.2. Consequently, more holes may be injected into the red light-emitting device than the green light-emitting device, suppressing the undesired light emitted by the green light-emitting device when the red light-emitting device is intentionally turned on.

In the disclosed embodiments, the hole transport units may be made of at least one of the first hole transport materials and the second hole transport materials. The mobility of the different hole transport materials may be different. The mobility may also be changed by mixing at least two different hole transport materials. In practical application, according to various application scenarios, various hole transport materials with different mobility may be selected to form the hole transport units, as long as the hole transport units corresponding to the light-emitting devices of different colors have different mobility, thereby suppressing the undesired light emitted by the subpixels adjacent to the lighted subpixel.

The first hole transport material may include carbazole-containing compounds, and the second hole transport material may include triphenylamine-containing compounds. The potential barrier at the interface between the hole transport material and the anode may be substantially low to facilitate the injection and transport of holes. Meanwhile, the hole transport material may be desired to have good thermal stability, which may help to keep the structure stability of the display device and avoid the performance degradation.

In one embodiment, at least one of triphenylamine-containing compounds and carbazole-containing compounds may be selected as the hole-transporting material, which have low ionization energy and strong electron-donating ability, and exhibit hole transport characteristics during constant electron-donating process. The hole transport materials include, but are not limited to, carbazole-containing compounds or triphenylamine-containing compounds, and any appropriate hole transport materials may be selected according to various application scenarios. The hole transport materials are not limited by the present disclosure The hole transport unit 131 corresponding to the blue light-emitting device B may be formed by the first hole transport material described in the compound (1); the hole transport unit 131 corresponding to the green light-emitting device G may be form by the second hole transport material described in the compound (2); and the hole transport unit 131 corresponding to the red light-emitting device R may be formed by mixing the first hole transport material described in the compound (1) and the second hole transport material described in the compound (2), where (1)

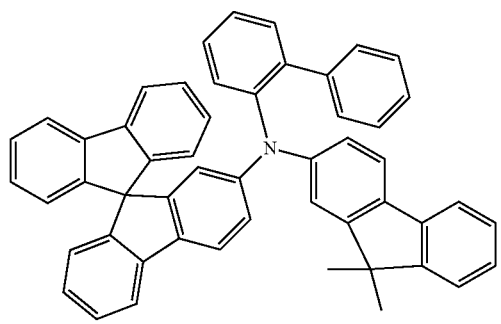

and (2)

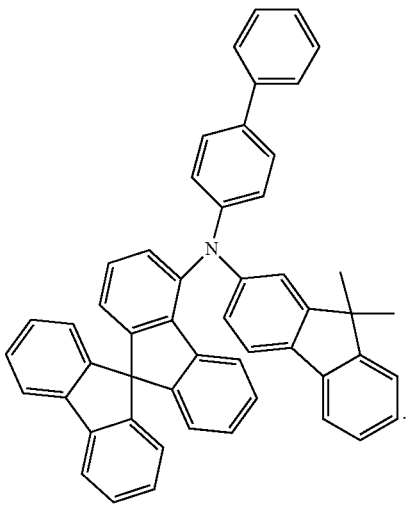

In particular, the hole transport unit corresponding to the red light-emitting device R may be formed by mixing the compound (1) and the compound (2) in a ratio of approximately 1:1.

In one embodiment, both the red light-emitting device R and the green light-emitting device G may include phosphorescent materials. The blue light-emitting device B may include fluorescent materials. That is, the phosphorescent material may serve as the luminescent material for the red light-emitting device R and the green light-emitting device G, and the fluorescent material may serve as the luminescent material for the blue light-emitting device B.

The advantages of adopting the red phosphorescent material in the red light-emitting device R and the green phosphorescent material in the green light-emitting device are that: the red phosphorescent material and the green phosphorescent materials may have high luminous efficiency and long lifetime which meet the commercial requirements. The reason why the blue light-emitting device B uses the blue fluorescent material is that the lifetime of the blue fluorescent material may be long enough to meet the commercial requirements, while the lifetime of the blue phosphorescent material may be too short to meet the commercial requirements.

The red light-emitting device R comprising red phosphorescent materials, the green light-emitting device G comprising green phosphorescent materials, and the blue light-emitting device B comprising the blue fluorescent materials may have large difference in the external quantum efficiency. In particular, given a current density of 10 mA/cm$^2$, the external quantum efficiency of the red light-emitting device R may be greater than or equal to 18%, the external quantum efficiency of the green light-emitting device G may be greater than or equal to 18%, and the external quantum efficiency of the blue light-emitting device B may be greater than or equal to 10%.

External quantum efficiency is explained as following. When the photons are incident onto the surface of a photosensitive device, some of the photons may stimulate the photosensitive material to produce electron-hole pairs to create a current, in which the ratio of the electrons generated to the number of all the incident photon is the external quantum efficiency.

The higher the external quantum efficiency, the higher the brightness of a light-emitting device. The undesired light emitted by the light-emitting devices adjacent to the turned-on light-emitting device may be related to the high brightness of the light-emitting devices. Because the external quantum efficiencies of the red light-emitting device R and the green light-emitting device G are substantially high, undesired light may be emitted by the red light-emitting device R and the green light-emitting device G.

In the disclosed embodiments, the lateral drift current of the holes may be reduced by adopting the first hole transport layer 130 to suppress the undesired light emitted by the light-emitting devices adjacent to the turned-on light-emitting device. Those skilled in the art would understand that, the first hole transport layer 130 may be able to suppress the undesired light emitted by the light-emitting devices adjacent to the turned-on light-emitting device in any OLED display panels, not limited to the OLED display panels in which the undesired light emitted by the light-emitting devices are caused by high external quantum efficiency.

In one embodiment, the red light-emitting device R may include at least one first host material and the first host material may include carbazole-containing compounds. The green light-emitting device G may include at least two second host materials, and the second host material may include carbazole-containing compounds. The blue light-emitting device B may include at least third host materials and the third host material may include aromatic compounds.

The carbazole compounds may have a high triplet energy and may have hole transport and electron transport properties. The use of carbazole-containing compounds as host materials may have the advantage of having sufficiently large triplet energy and carrier transport properties. The aromatic compounds may have a large conjugated plane, and may also have a relatively strong electron accepting ability and electron transport properties, but may not form a complex with luminescent materials.

Those skilled in the art would understand that a variety of carbazole-containing compounds may be used as the host material of the red light-emitting device, and a variety of carbazole-containing compounds may be used as the host material of the green light-emitting device, and a variety of aromatic compounds may be used as the host material of the blue light-emitting device, which are not limited by the present disclosure.

Further, three exemplary OLED display panels (examples 1 to 3) are given below to illustrate the influence of different mobility of the hole transport units corresponding to the different color light-emitting devices on the display performance of the OLED display panels. Only the buffer layer Buffer, the second hole transport layer HTL-2, the hole transport unit (R-Prime, G-Prime, or B-Prime corresponding to the light-emitting device of red, green or blue color respectively), the light-emitting device, the electron transport layer ETL, the second electrode layer Cathode, and the capping layer of the OLED display panel of three examples are described below. The OLED display panel may also include other appropriate components, which are not illustrated here.

The OLED display panels of examples 1 to 3 may have the following structure:
R: Buffer/HTL-2/R-Prime/R-host:R-dopant/ETL/Cathode/CPL;
G: Buffer/HTL-2/G-Prime/G-host:G-dopant/ETL/Cathode/CPL;
B: Buffer/HTL-2/B-Prime/B-host:B-dopant/ETL/Cathode/CPL.

In the three exemplary OLED display panels, the buffer materials forming the buffer layer Buffer may include compounds having a chemical formula of

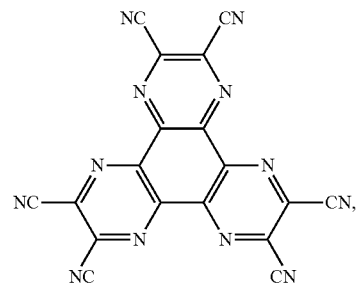

The hole transport material forming the second hole transport layer HTL-2 may include compounds having a chemical formula of

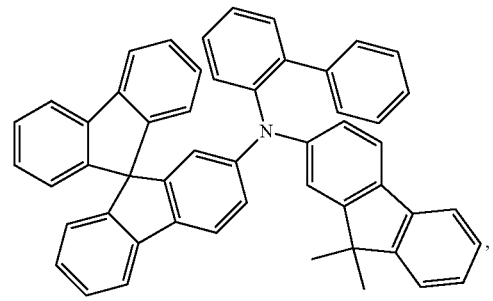 [SMILES: CC1(C)c2ccccc2-c2ccc(N(c3ccc4c(c3)C3(c5ccccc5-c5ccccc53)c3ccccc3-4)c3ccccc3-c3ccccc3)cc21]

The red light-emitting device R may comprise red host light-emitting materials R-host and red phosphorescent materials R-dopant, in which the R-host may include the following compound (R-1) and the R-dopant may include the following compound (R-2):

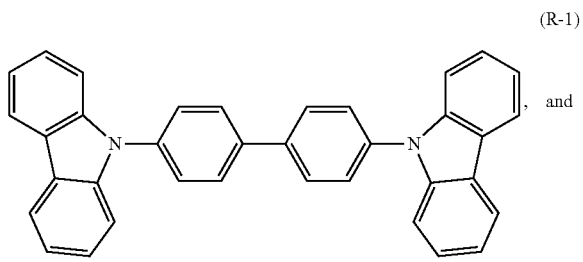
(R-1), and

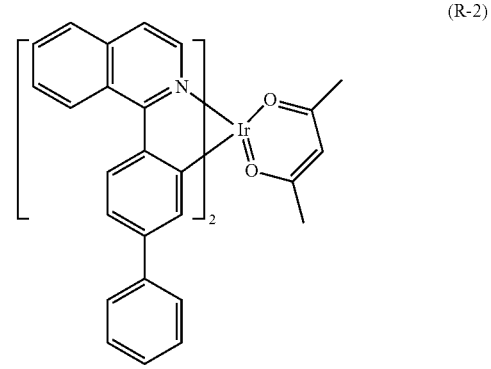
(R-2)

The green light-emitting device G may include green host light-emitting materials G-host and green phosphorescent materials G-dopant, in which the G-host may include the following compound (G-1) and the G-dopant may include the following compound (G-2):

(G-1)

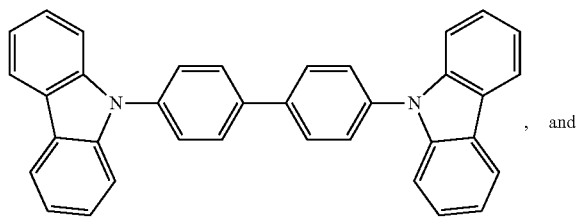

, and (G-2)

The electron transport material forming the electron transport layer ETL may include compounds having a chemical formula of

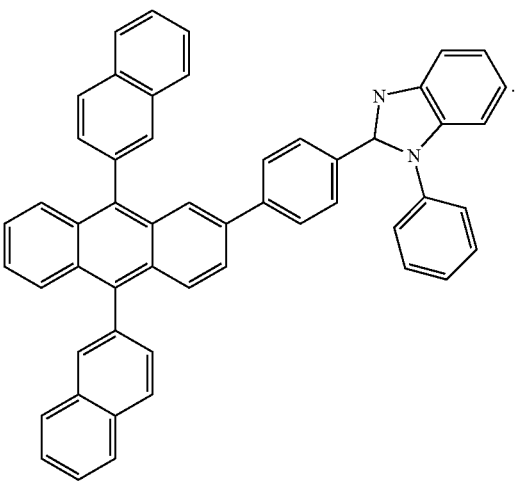 [SMILES: c1ccc(N2c3ccccc3NC2c2ccc(-c3ccc4c(-c5ccc6ccccc6c5)c5ccccc5c(-c5ccc6ccccc6c5)c4c3)cc2)cc1]

The blue light-emitting device B may include blue host light-emitting materials B-host and blue fluorescent materials B-dopant, in which the B-host may include the following compound (B-1) and the B-dopant may include the following compound (B-2):

The cathode material for forming the second electrode layer (Cathode) may include magnesium-silver alloys.

The capping material for forming the capping layer (CPL) may include compounds have a chemical formula of (B-1)

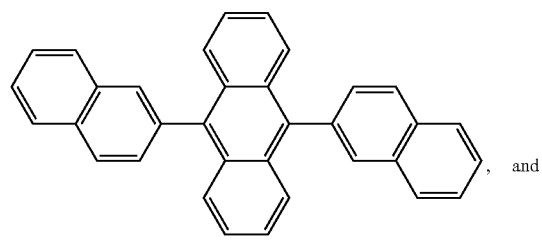

, and (B-2)

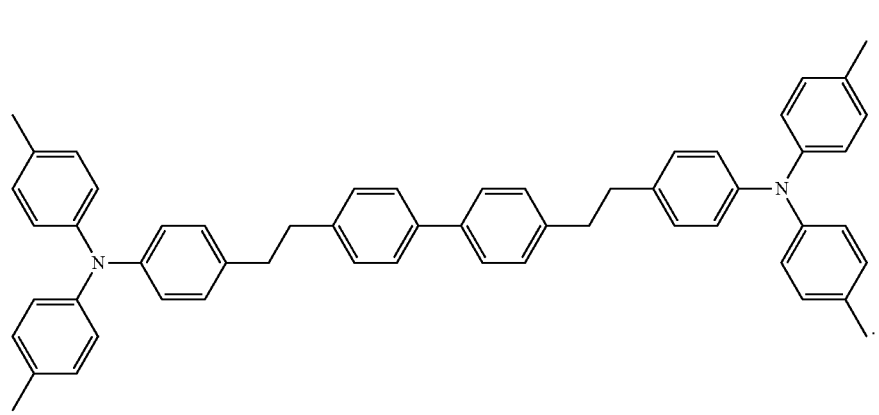

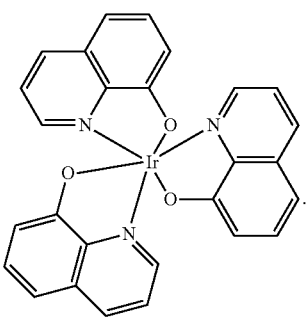

In the OLED display panels, the hole transport units (R-Prime, G-Prime and B-Prime) may be different in examples 1 to 3.

In the OLED display panel in example 1, the hole transport unit R-Prime corresponding to the red light-emitting device R may be a hole transport material HTL3 formed by mixing the first hole transport material HTL1 described in the compound (1) and the second hole transport material HTL2 described in the compound (2) in a ratio of approximately 1:1, i.e.

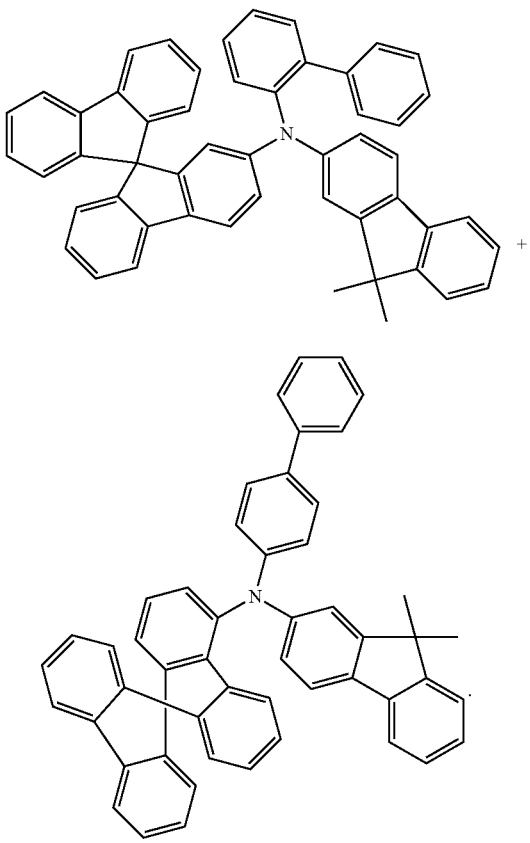

The hole transport unit G-Prime corresponding to the green light-emitting device G may be formed of the second hole transport material HTL2 described in the compound (2). i.e.

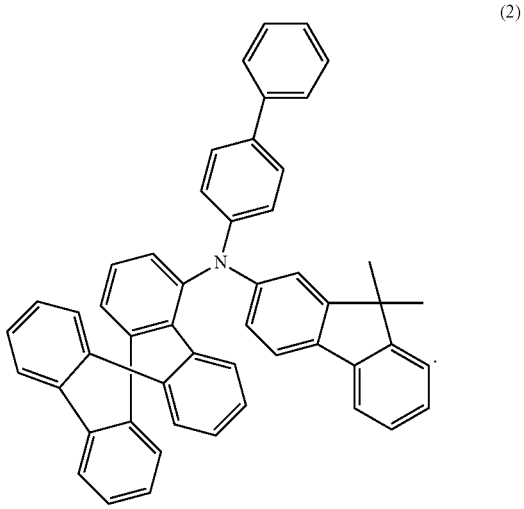 [SMILES: CC1(C)c2ccccc2-c2ccc(N(c3ccc(-c4ccccc4)cc3)c3cccc4c3-c3ccccc3-c3ccccc3-c3ccccc3C4)cc21]

The hole transport unit B-Prime corresponding to the blue light-emitting device B may be formed of the first hole transport material HTL1 described in the compound (1), i.e.

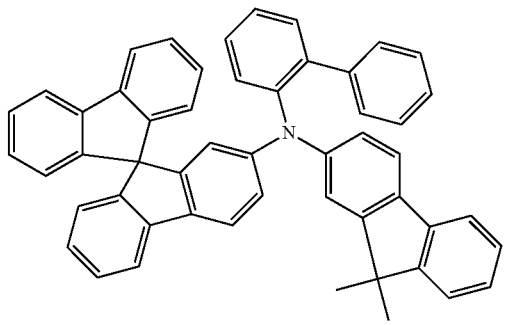

In the OLED display panel in example 2, the hole transport unit R-Prime corresponding to the red light-emitting device R and the hole transport unit G-Prime corresponding to the green light-emitting device G may be each formed of the second hole transport material HTL2 described in the compound (2). i.e.

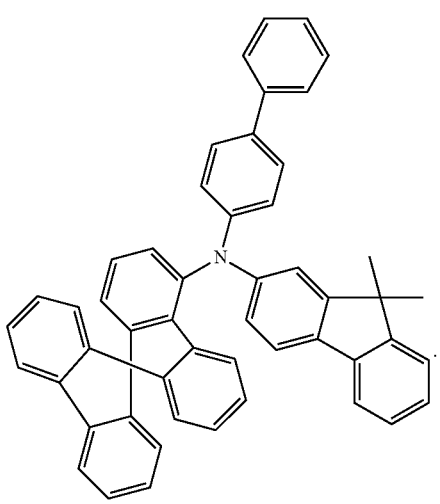

The hole transporting unit B-Prime corresponding to the blue light-emitting device B may be formed of the first hole transport material HTL1 described in the compound (1), i.e.

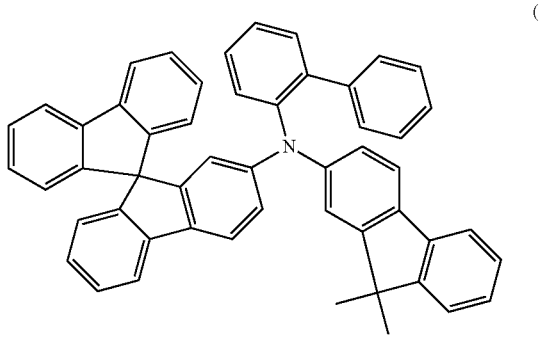

(1)

In example 3, the hole transport unit R-Prime corresponding to the red light-emitting device R, the hole transport unit G-Prime corresponding to the green light-emitting device G, and the hole transport unit B-Prime corresponding to the blue light-emitting device B may all be formed of the first hole transport material HTL1 as described in the compound (1), i.e.,

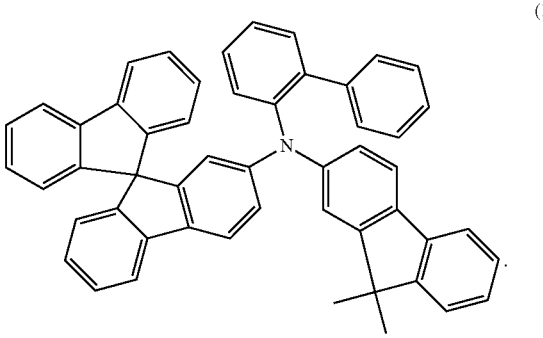

(1)

The mobility of HTL1 described in the compound (1) may be approximately $7*10^{-4}$ (cm$^2$/Vs); the mobility of HTL2 described in the compound (2) may be approximately $2*10^{-5}$ (cm$^2$/Vs); the mobility of the hole transport material HTL3 formed by mixing the compound (1) with the compound (2) may be approximately $1*1^{-4}$ (cm$^2$/Vs).

In example 1, the mobility of the hole transport units corresponding to any two light-emitting devices of different colors may be different. The ratio of Mobility$_B$ to Mobility$_G$ may be approximately 35. The ratio of Mobility$_R$ to Mobility$_G$ may be approximately 5.

In example 2, the mobility of the hole transport units corresponding to the red light-emitting device and the green light-emitting device may be same. The ratio of Mobility$_B$ to Mobility$_G$ may be approximately 35. The ratio of Mobility$_R$ to Mobility$_G$ may be approximately 1.

In example 3, the mobility of the hole transport units corresponding to the red light-emitting device, the green light-emitting device, and the green light-emitting device may be same. The ratio of Mobility$_B$ to Mobility$_G$ may be approximately 1. The ratio of Mobility$_R$ to Mobility$_G$ may be approximately 1.

The inventors prepared the three types of OLED display panels and conducted test on the display performance of these panels. The results are shown below.

In the OLED display panel shown in example 1, when a light-emitting device of any color was turned on, the OLED display panel emitted light evenly and no light-emitting devices were undesirably lit. That is, undesired light was suppressed in the OLED display panel.

In the OLED panel shown in example 2, when the light-emitting device of red color was turned on, the green light-emitting device was undesirably lit in the OLED display panel. That is, undesired green light occurred in the OLED display panel.

In the OLED display panel shown in example 3, when the light-emitting device of blue color was turned on, the green and red light-emitting devices were undesirably lit in the OLED display panel. That is, undesired red and green light occurred in the OLED display panel. When the light-emitting device of red color was turned on, the green light-emitting device was undesirably lit in the OLED display panel. That is, undesired green light occurred in the OLED display panel.

Thus, in the disclosed embodiments, through configuring the hole-transport units corresponding to the light-emitting devices of any two colors to have different mobility, the undesired light emitted by the subpixels adjacent to the turned-on subpixel may be suppressed. Accordingly, the crosstalk of the OLED display panel may be reduced, and the performance of the OLED display panel may be enhanced.

Figure 6:
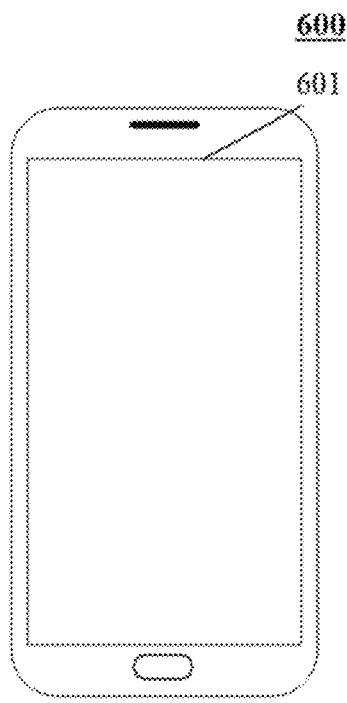
FIG. 6 illustrates a schematic view of an exemplary OLED display device consistent with disclosed embodiments.

The present disclosure also provides an OLED display device. FIG. 6 illustrates a schematic view of an exemplary OLED display device 600 consistent with disclosed embodiments. As shown in FIG. 6, the OLED display device 600 may include any one of the disclosed OLED display panels 601. The disclosed OLED display device 600 may be a cell phone, a tablet, a monitor, and a smart wearable display device, etc. Any OLED display device comprising any one of the disclosed OLED display panels will fall within the scope of the present disclosure. Although a smart phone is shown FIG. 6, the disclosed OLED display device is not limited to the smart phone.

In one embodiment, the OLED display panel may have a top-emitting structure, in which the light emitted from the light-emitting device passes through the surface on the same side as the second electrode layer. In another embodiment, the OLED display panel may have a bottom-emitting structure, in which the light emitted from the light-emitting device passes through the surface on the same side as the first electrode. In another embodiment, the OLED display panel may have a double-sided light-emitting structure, in which the light emitted from the light-emitting device passes through the surface on the same side as the second electrode layer and the surface on the same side as the first electrode simultaneously.

Those skilled in the art would understand that the film materials and properties may be selected according to various application scenarios. In one embodiment, when the OLED display panel has a top-emitting structure, semi-transparent or transparent conductive materials may be selected for the second electrode layer. In another embodiment, when the OLED display panel has a bottom-emitting structure, the light transmittance of the second electrode layer may not have to be defined In one embodiment, the light-emitting devices may include light-emitting materials of different colors. For example, a red light-emitting device may be formed of a red light-emitting material, a green light-emitting material may be formed of a green light-emitting material, and a blue light-emitting device may be formed of a blue light-emitting material.

In another embodiment, the light-emitting device may comprise a white light-emitting element and a color filter film. For example, the red light-emitting device may comprise a white light-emitting element and a red color light filter film which are arranged in layers; the green light-emitting device may comprise a white light-emitting element and a green color light filter film which are arranged in layers; the blue light-emitting device may comprise a white light-emitting element and a blue color filter film arranged in layers. The light-emitting element and the filter film may be arranged according to the light-emitting structure of the OLED display panel. For example, a color filter film in the top-emitting light-emitting structure may be disposed on the surface of the light-emitting element far away from the first electrode layer.

In the disclosed OLED display panels, the first electrode layer may be a block or include a plurality of striped electrodes, and the second electrode layer may be a surface or include a plurality of striped electrodes. The electrode shapes and structures are for illustrative purposes and are not intended to limit the scope of the present disclosure. The electrode shapes and structures may vary according to various application scenarios.

The disclosed OLED display panel may comprise a first substrate, a first electrode layer including a plurality of first electrodes on the first substrate, a first hole transport layer disposed on the surface of the first electrode layer far away from the first substrate, a plurality of light-emitting devices disposed on the surface of the first hole transport layer far away from the first electrode layer, and a second electrode layer disposed on the surface of the plurality of light-emitting devices far away from the first hole transport layer. The first hole transport layer may comprise a plurality of hole transport units, and the plurality of hole transport units may be corresponding to the plurality of first electrodes respectively. The plurality of the light-emitting devices may be arranged in correspondence with the plurality of hole transport units, and the light-emitting devices may include m colors.

Through providing the hole transport units corresponding to the light-emitting devices of any two different colors with different mobility, the undesired light emitted by adjacent subpixels may be suppressed. Accordingly, the crosstalk of the OLED display panels and devices may be reduced, and the performance of the OLED display panels and devices may be improved.

The description of the disclosed embodiments is provided to illustrate the present invention to those skilled in the art. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An organic light-emitting diode (OLED) display panel, comprising:
    a first substrate;
    a first electrode layer disposed on the first substrate and including a plurality of first electrodes;
    a first hole transport layer disposed on a surface of the first electrode layer far away from the first substrate, and including a plurality of hole transport units, wherein the plurality of hole transport units are arranged in correspondence with the plurality of first electrodes respectively;
    a plurality of light-emitting devices disposed on a surface of the first hole transport layer far away from the first electrode layer, wherein the plurality of the light-emitting devices are arranged in correspondence with the plurality of hole transport units respectively, the light-emitting devices include m number of colors, where m is a positive integer, one light-emitting device corresponds to one color, and the hole transport units corresponding to the light-emitting devices of two different colors have different mobility; and
    a second electrode layer disposed on a surface of the plurality of light-emitting devices far away from the first hole transport layer.

2. The OLED display panel according to claim 1, wherein:
    the plurality of light-emitting devices further include a plurality of red light-emitting devices, a plurality of green light-emitting devices, and a plurality of blue light-emitting devices.

3. The OLED display panel according to claim 2, wherein:
    a mobility $Mobility_R$ of a hole transport unit corresponding to a red light-emitting device and a mobility $Mobility_G$ of a hole transport unit corresponding to a green light-emitting device are respectively smaller than a mobility $Mobility_B$ of a hole transport unit corresponding to a blue light-emitting device.

4. The OLED display panel according to claim 3, wherein a ratio of $Mobility_B$ to $Mobility_G$ is approximately greater than or equal to 5.

5. The OLED display panel according to claim 4, wherein a ratio of $Mobility_B$ to $Mobility_G$ is approximately greater than or equal to 10.

6. The OLED display panel according to claim 3, wherein $Mobility_G$ is smaller than $Mobility_R$.

7. The OLED display panel according to claim 6, wherein a ratio of $Mobility_R$ to $Mobility_G$ is approximately greater than 1.

8. The OLED display panel according to claim 7, wherein the ratio of $Mobility_R$ to $Mobility_G$ is approximately greater than 1.2.

9. The OLED display panel according to claim 2, wherein a hole transport unit is formed by at least one of a first hole transport material and a second hole transport material.

10. The OLED display panel according to claim 9, wherein the first hole transport material includes carbazole-containing compounds, and the second hole transport material includes triphenylamine-containing compounds.

11. The OLED display panel according to claim 10, wherein:
    the hole transport unit corresponding to the green light-emitting device is formed by the second hole transport material including a compound (2);
    the hole transport unit corresponding to the blue light-emitting device is formed of the first hole transport material including a compound (1); and
    the hole transport unit corresponding to the red light-emitting device is formed by mixing the first hole transport material including the compound (1) and the second hole transport material including the compound (2), wherein the compound (1) is

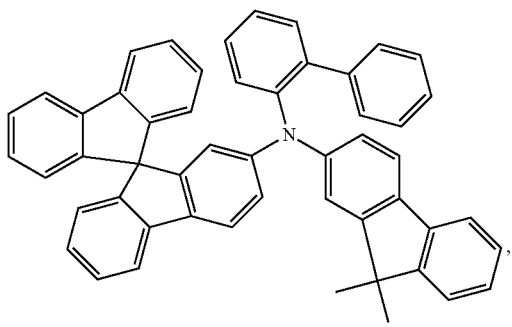 [SMILES: CC1(C)c2ccccc2-c2ccc(N(c3ccc4c(c3)C3(c5ccccc5-c5ccccc53)c3ccccc3-4)c3ccccc3-c3ccccc3)cc21]

and
the compound (2) is

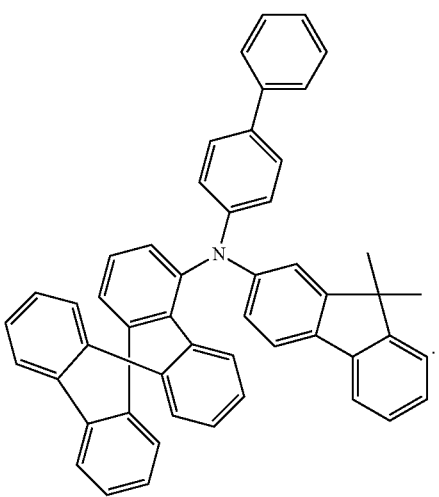 [SMILES: CC1(C)c2ccccc2-c2ccc(N(c3ccc(-c4ccccc4)cc3)c3cccc4c3-c3ccccc3-c3ccccc3-c3ccccc3C4)cc21]

12. The OLED display panel according to claim 2, wherein:
both the red light-emitting device and the green light-emitting include phosphorescent materials; and
the blue light-emitting device includes fluorescent materials.

13. The OLED display panel according to claim 12, wherein:
the red light-emitting device includes at least one first host material, and the at least one first host material includes carbazole-containing compounds;
the green light-emitting device includes at least two second host materials, and the at least two second host materials include carbazole-containing compounds; and
the blue light-emitting device includes at least two third host materials, and the at least two third host materials includes aromatic compounds.

14. The OLED display panel according to claim 1, wherein the first electrode further includes at least:
a reflective film disposed on the first substrate and including silver; and
a transparent conductive film disposed on the surface of the reflective film far away from the first substrate, and including indium tin oxide or indium zinc oxide,
wherein the second electrode includes at least any one of a magnesium-silver alloy, a silver metal, a silver-ytterbium alloy, and a silver-rare earth metal alloy.

15. The OLED display panel according to claim 1, wherein the first substrate is a ftexible substrate or a rigid substrate.

16. The OLED display panel according to claim 15, wherein the flexible substrate includes polyimide or polyethylene terephthalate resin.

17. The OLED display panel according to claim 1, further including:
a second hole transport layer disposed on a surface of the first electrode layer far away from the first substrate; and
an electron transport layer disposed on a surface of the plurality of light-emitting devices far away from the first hole transport layer.

18. The OLED display panel according to claim 17, further including:
a hole blocking layer disposed between the plurality of light-emitting devices and the electron transport layer.

19. The OLED display panel according to claim 18, wherein the hole blocking layer includes star-shaped aromatic compounds.

20. An organic light-emitting diode (OLED) display device, comprising the OLED display panel according to claim 1.

* * * * *